United States Patent [19]

Esho et al.

[11] 4,302,822

[45] Nov. 24, 1981

[54] THIN-FILM MAGNETIC BUBBLE DOMAIN DETECTION DEVICE AND PROCESS FOR MANUFACTURING THE SAME

[75] Inventors: Sotaro Esho; Hiroshi Gokan, both of Tokyo, Japan

[73] Assignee: Nippon Electric Co., Ltd., Tokyo, Japan

[21] Appl. No.: 36,983

[22] Filed: May 8, 1979

[30] Foreign Application Priority Data

May 12, 1978 [JP] Japan ................................ 53-56780
Feb. 14, 1979 [JP] Japan ................................ 54-16667
Feb. 14, 1979 [JP] Japan ................................ 54-16668

[51] Int. Cl.³ .............................................. G11C 19/08
[52] U.S. Cl. .......................................... 365/8; 365/39
[58] Field of Search ...................... 365/7, 8, 9, 10, 39, 365/158

[56] References Cited

U.S. PATENT DOCUMENTS 3,996,575 12/1976 Battarel ............................... 365/158
4,079,359 3/1978 Gergis ................................. 365/39
4,172,758 10/1979 Bailey .................................. 365/39

Primary Examiner—James W. Moffitt
Attorney, Agent, or Firm—Fitzpatrick, Cella, Harper & Scinto

[57] ABSTRACT

A thin-film bubble domain detection device for use in a magnetic bubble memory comprises two metallic conductor leads formed with sloped opposing edges on the $SiO_2$ spacer layer of a garnet substrate and a permalloy magnetoresistive sensing element formed therebetween. A method for making the device uses a first photoresist mask in ion milling in a conductor layer to expose an area of spacer, followed by deposit of a permalloy film over the substrate and onto the exposed spacer before removal of the first mask. Extraneous permalloy is lifted off when the first photoresist is removed. A second mask is used to simultaneously ion mill the final conductor lead and sensing element configurations. In one embodiment, first and second dielectric layers are added to the device to improve bubble propagation and provide an easily planned product.

22 Claims, 13 Drawing Figures

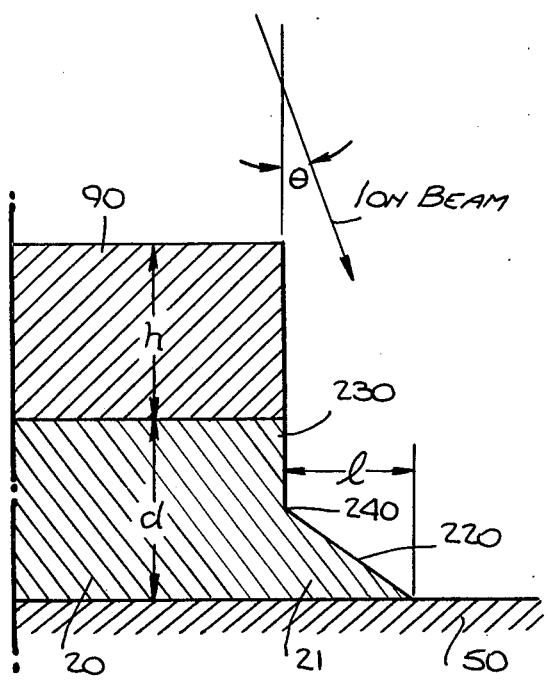
Fig. 7A.
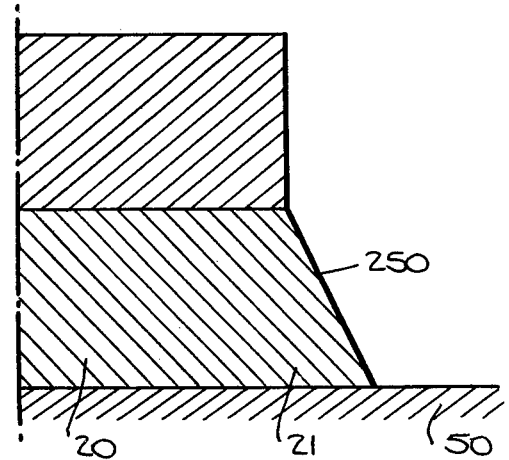
Fig. 7B.
Fig. 8.
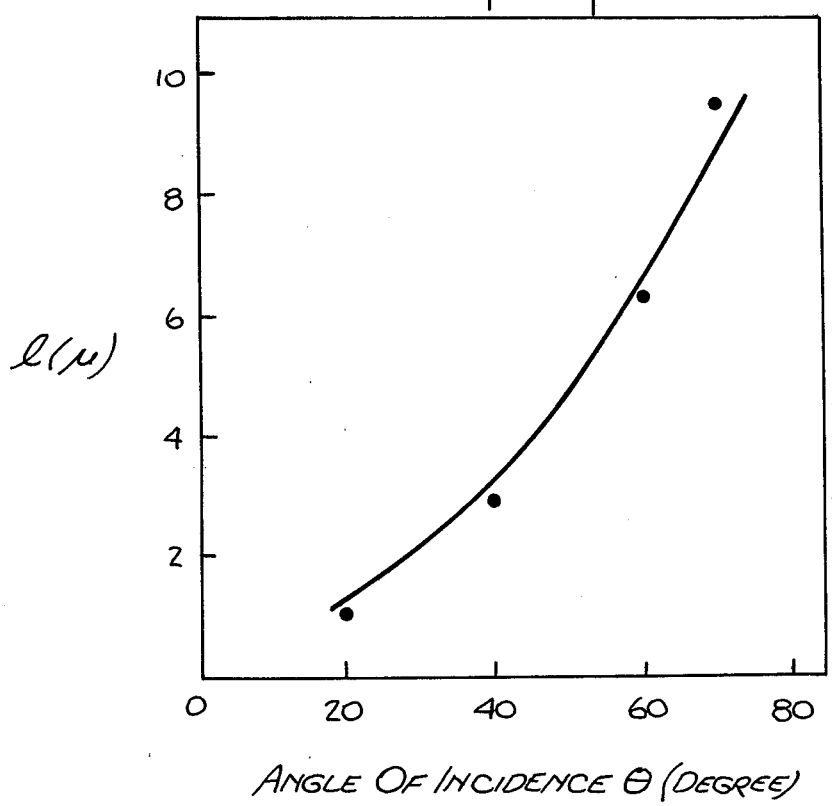
ANGLE OF INCIDENCE θ (DEGREE)

THIN-FILM MAGNETIC BUBBLE DOMAIN DETECTION DEVICE AND PROCESS FOR MANUFACTURING THE SAME

This invention relates to a thin-film magnetic bubble domain detection device and a process for manufacturing the same.

A magnetic bubble domain (hereunder referred to as bubble) detection device for use in a magnetic bubble memory includes a magnetoresitance element (MR element) or a Hall element as a magnetic field sensing element. Owing to high detection capability and ease of manufacture, however, the MR element is more widely put into practical use. Bubble detection devices including Mr elements are largely classified into thin-film types and a thick-film types, examples of which are disclosed in U.S. Pat. Nos. 4,031,526 (Reference 1) and 3,702,995 (Reference 2), respectively. The thick-film bubble detection device is fabricated on a substrate simultaneously with a bubble propagation pattern. With the thick-film type device, however, in order to facilitate the propagation of bubbles the film thickness cannot be reduced to less than 3000 to 5000 angstroms, with the result that the detection of bubbles of one micron in diameter may not be attained. On the other hand, the thin-film detection device is fabricated on the substrate independently of the propagation pattern in a selected film thickness of less than 500 angstroms to achieve the detection of bubbles of less than one micron in diameter. The thin-film detection device is thus a useful magnetic field sensing means to meet the requirements of high storage density.

The detection of the magnetic field of small bubbles by means of a thin-film detection device must be effected under low-noise conditions using high-conductivity conductor leads for stable electric connection of the magnetic field sensing element with an external (electric) circuit. Typical conventional connection of the sensing element with the external circuit is made by placing the conductor leads on the sensing element each with one end coupled with an end of the element.

One process for forming such a sensing element to conductor connection is disclosed in an article entitled, "Fabrication of $10^4$ Bit Permalloy-First Magnetic Bubble Circuits on Epitaxial Garnet Chips" by J. P. Reekstin et al., Journal of Vacuum Science and Technology, Vol. 10, No. 5, pp 847-851, 1973 (Reference 3). This process utilizes chemical wet etching for the fabrication of the conductor leads. This presents problems such that fine fabrication cannot be achieved, strict limitations are imposed on materials used for the conductor leads in order to prevent the degradation of the magnetic field sensing element, and a number of manufacturing steps are needed to accomplish the above-mentioned connection.

To overcome these problems, a thin-film detection device of the type disclosed in the Japenese Patent Application Disclosure No. 43237/1973 (Reference 4) was proposed. In this device, however, since permalloy is placed under the overall surface of the conductor lead layer, the flux of such permalloy impairs bubble propagation characteristics. Also, the trapping of transferred bubbles occurs, resulting in the failure of detection of bubbles of less than 3 microns in diameter. In a typical magnetic bubble memory, a part of the bubble propagation pattern is formed on the patterns of the bubble detection device and the conductors which serve particular functions such as bubble generation, bubble annihilation, etc. Consequently, differences in level between the propagation pattern and the substrate tend to occur. These differences in level degrade bubble propagation characteristics to a greater extend for bubbles with reduced diameters. It is, therefore, desirable that a small bubble detection device is made as flat as possible so as to minimize the differences in level between the patterns.

An object of the present invention is therefore to provide a thin-film bubble detection device, and a process for manufacturing the same, which are free of the above-described drawbacks and suited for the detection of small bubbles.

In accordance with the present invention, an improved thin-film bubble detection device is provided comprising: a substrate; a spacer formed on the substrate to cover the overall surface thereof; two conductor leads formed on the spacer and respectively having at least one slope along one side wall thereof; and a magnetic field sensing element formed on the spacer and electrically connected to the conductor leads at the slopes thereof.

According to another aspect of the present invention, an improved process for manufacturing a thin-film bubble detection device is provided comprising the following steps: Depositing a spacer and a conductor film onto a substrate, in that order, and, using a first mask, removing the conductor film from a predetermined region larger in area than that of the magnetic field sensing element of the detection device; depositing a magnetic field sensing film thereon without removing the first mask used in the first step, and removing the magnetic field sensing film formed on the area other than said region by lifting off the mask; and delineating the conductor film and the magnetic field sensing film into a detection device configuration using a second mask.

The invention and its features will be more fully understood from the following detailed description taken in conjunction with the appended drawings in which:

FIGS. 7A and 7B illustrate a dry etching technique for use in the present invention;

FIGS. 8 and 9 are graphs useful in understanding the present invention.

Figure 11:
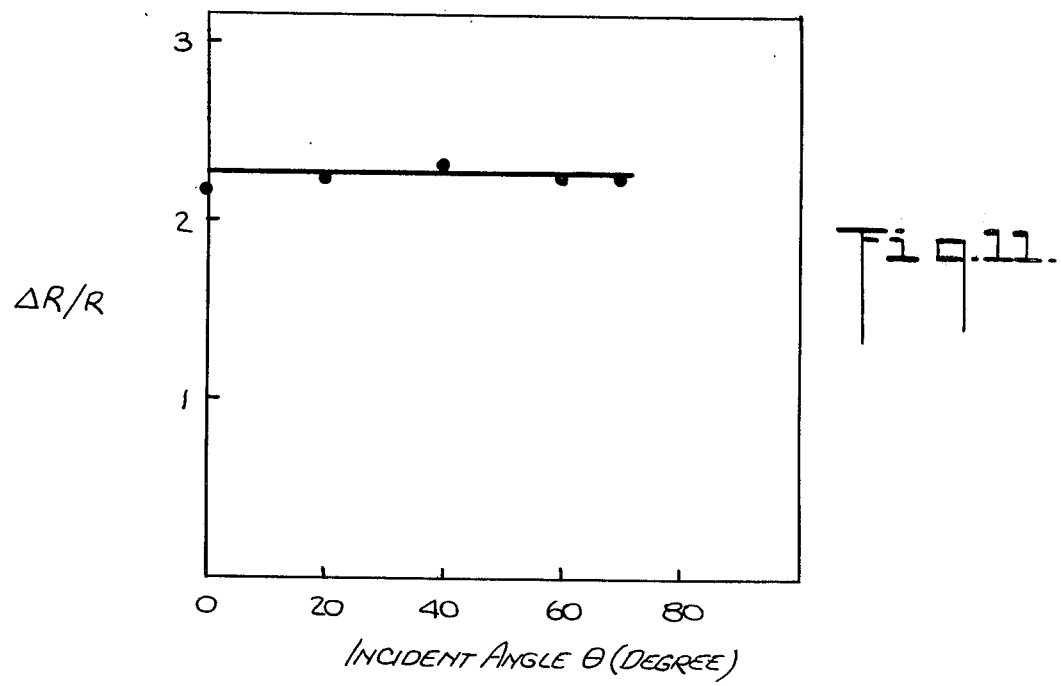
Figure 10:
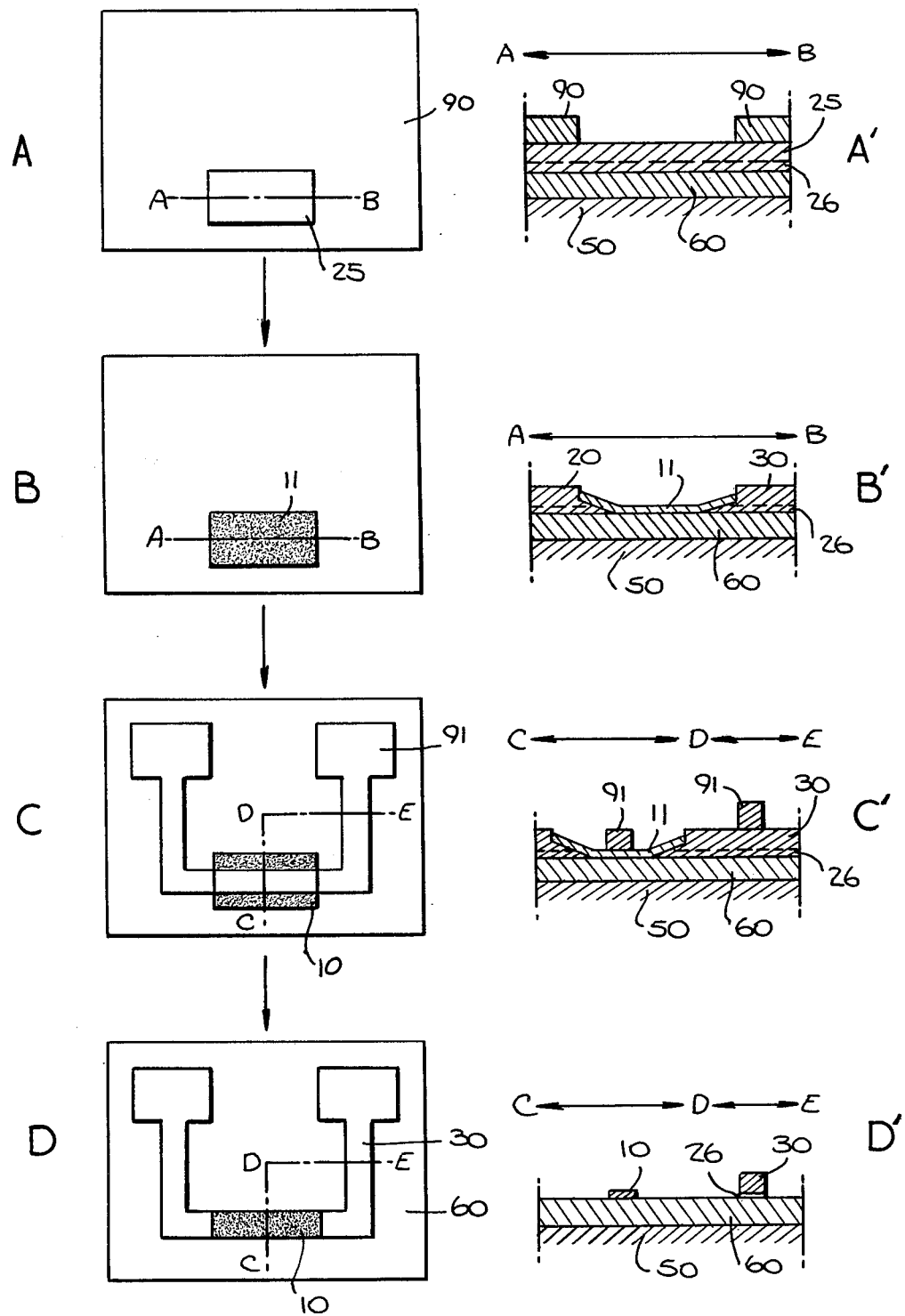

FIGS. 10 A through 10 D and 10 A' through 10 D' illustrate a process of manufacturing the present detection device; and FIG. 11 illustrates a graph useful in understanding the results brought about by the detection device of the present invention.

Throughout the drawings, like reference numerals represent like structural elements.

Figure 1:
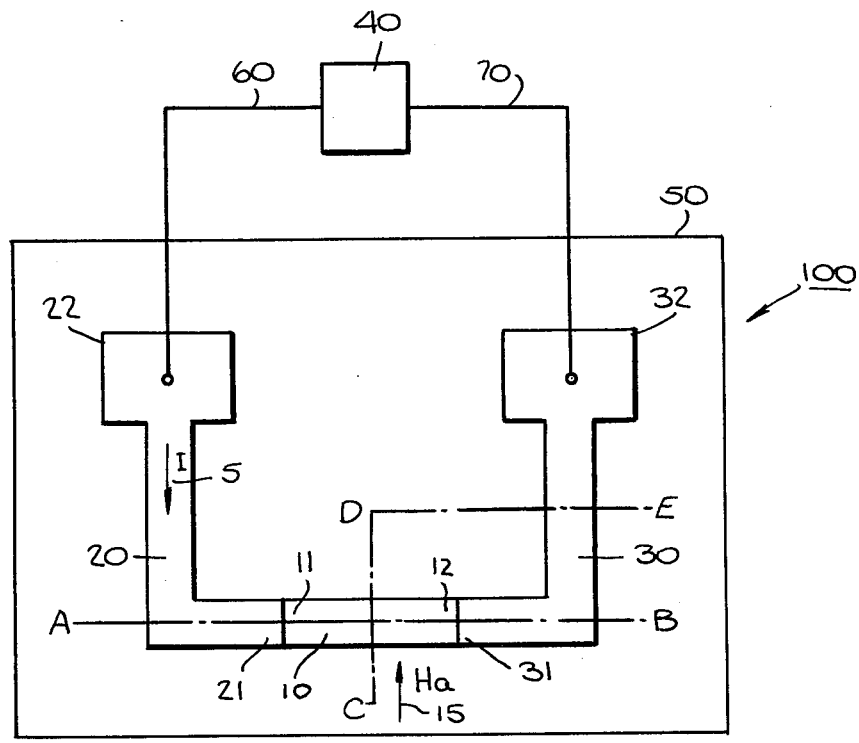
FIG. 1 is a diagram showing a prior art bubble detection device.
Figure 2A:
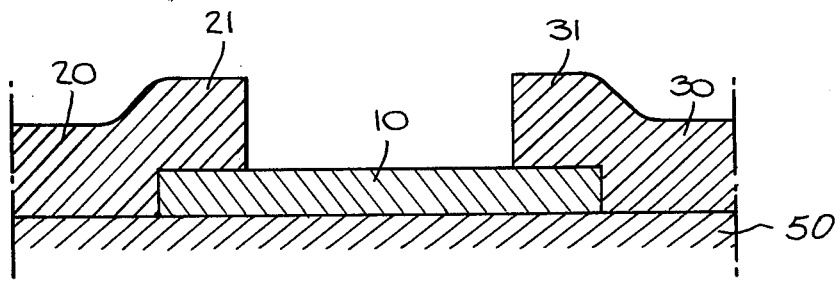
FIGS. 2A and 2B are cross-sectional views of the detection device of FIG. 1 showing two forms of prior art device.
Figure 2B:
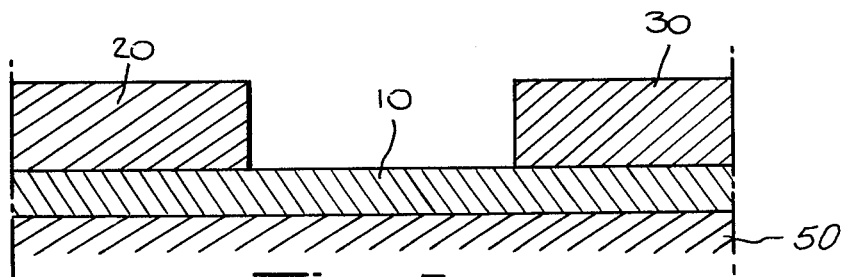

Referring to FIGS. 1, 2A and 2B, a conventional thin-film bubble detection device 100 comprises a magnetic field sensing element 10 formed of permalloy on a substrate 50 of magnetic material (such as magnetic garnet) to detect a change in magnetic field in response to bubble propagation, and conductor leads 20 and 30 connected to the opposite ends of the sensing element 10. The detection device 100 is connected by way of lead wires 60 and 70 to an external detection circuit 40 which consists of a constant current circuit and a differential amplifier (both not shown) to detect a change in voltage in response to the change in magnetic field. This detection device is of the same type as the detection device 29 and 23 shown in Reference 1, which is placed above and adjacent to the chevron patterns 10–14 and 25 which are utilized for the bubble propagation.

Referring to FIGS. 1, 2A and 2B again, a detection current I (represented by the arrow at reference numeral 5) is constantly applied from the external detection circuit 40 to the element 10. When the intensity of an external magnetic field Ha (represented by the arrow at reference numeral 15) to be detected changes, the change in resistance owing to the magnetoresistance effect on the magnetic field sensing element 10 is converted into a voltage change by the circuit 40. A Hall element, such as indium antimony, may be used as the element 10 to give the same effect as permalloy in a manner such that the change in resistance owing to the Hall effect is converted into a voltage change by the detection circuit 40.

The connection of the sensing element 10 with the conductor leads 20 and 30 is typically conventionally achieved by placing the opposite ends 11 and 12 of the element 10 under the ends 21 and 31 of the conductor leads 20 and 30, respectively, as shown in FIG. 2A. Alternatively, the element 10 may conventionally be positioned under the full length of conductor leads 20 and 30, as shown in FIG. 2B. The structures of the prior art detection devices shown in FIGS. 2A and 2B correspond to those disclosed in References 3 and 4, respectively. However, these detection devices are accompanied by drawbacks such as a complicated manufacturing process and lack of reproducibility and reliability. Particularly in the structure of FIG. 2B, the element 10 placed under the conductor leads 20 and 30 degrades bubble domain propagation characteristics for bubbles of less than 3 microns in diameter.

Figure 3:
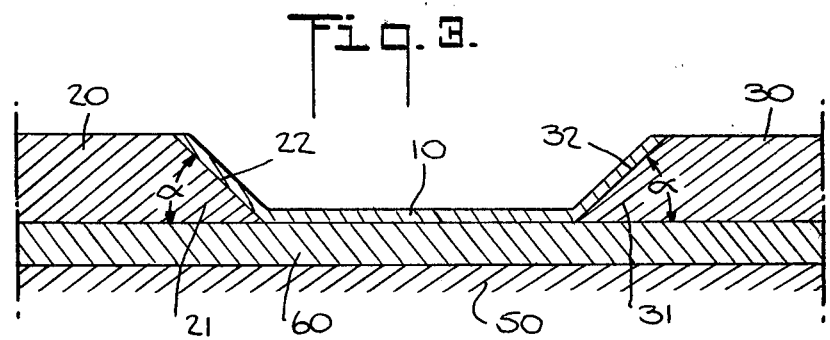
FIG. 3 is a view corresponding to the views of FIGS. 2A and 2B but showing a bubble detection device according to the present invention.

Referring to FIG. 3, a bubble detection device according to the present invention comprises the conductor leads 20 and 30, the sensing element 10, a spacer 60 consisting of silicon dioxide, and a substrate 50 made of magnetic garnet. Edges 21 and 31 of the conductor leads 20 and 30, at which the conductor leads are connected to the element 10, have side walls 22 and 32 each making a slope at an angle $\alpha$ of smaller than 90° with respect to the plane of the substrate 50. The element 10 and the conductor leads 20 and 30 are connected to each other at the side walls 22 and 32 of the conductor leads.

Figure 4:
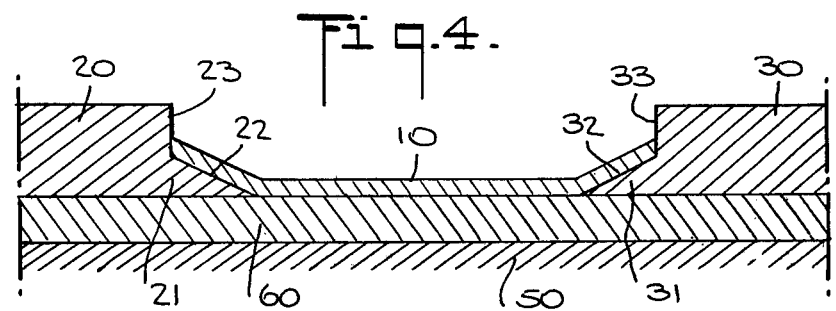
FIGS. 4 and 5 are views similar to FIG. 3 but showing modifications of the present invention.

Referring to FIG. 4 which shows a modified form of detection device of the present invention, the edges 21 and 31 of the conductor leads 20 and 30, at which the magnetic field sensing element 10 is connected to the conductor leads, have side walls 22, 23, and 32, 33. More specifically, each side wall has two slopes relative to the plane of substrate 50. The gradients of the lower slopes 22 and 32 neighbouring the spacer 60 are low compared with those of the upper slopes 23 and 33. The element 10 is connected to the conductor leads 20 and 30 at the lower slopes 22 and 32 thereof.

Figure 5:
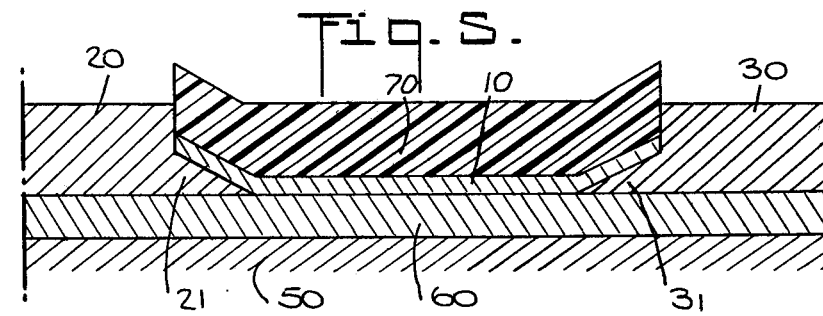

Referring to FIG. 5, a further modification of the detection device of FIG. 3 has a side wall contour as shown in FIG. 4 and a first dielectric layer 70 formed on the top surface of the detection element 10. The width and length of the layer 70 are selected to be substantially equal to those of the element 10, but the thickness of the layer should be properly selected depending on the size of the detection device to be formed. In a bubble memory, the thickness of the first dielectric layer should be determined in such a manner that the sum of the thicknesses of the element 10 and the layer 70 at the center of the sensor (as shown in FIG. 6) is equal to the thicknesses of the conductor leads 20 and 30 so as to provide an improved bubble propagation characteristic.

Figure 6:
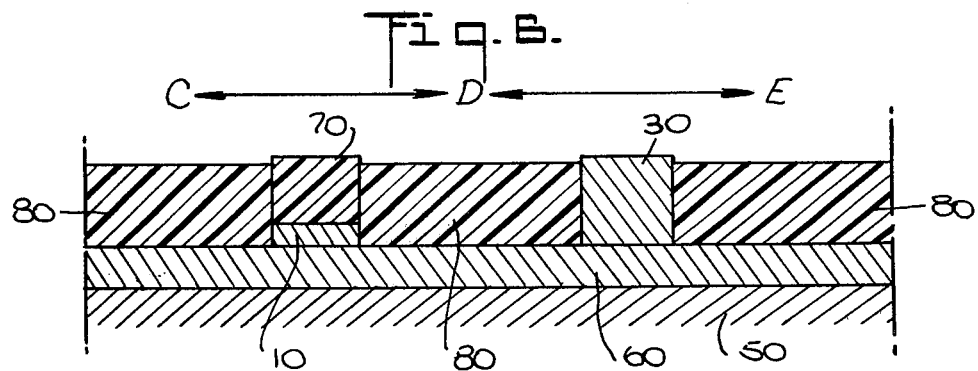
FIG. 6 is a cross-sectional view of a further modification of bubble detection device according to the present invention, said view being taken along a line corresponding to section line C-D-E shown in FIG. 1.

FIG. 6 is a cross sectional view of another improved detection device of the invention, taken along the dotted line C-D-E of FIG. 1. The conductor leads 20 and 30 and the element 10 are connected to each other in the same manner as that shown in FIG. 3 or FIG. 4. The width and the length of the layer 70 formed on the element 10 are selected to be equal to those of the element 10. The sum of the thicknesses of the element 10 and the layer 70 is substantially equal to the thicknesses of the conductor lead 30. A second dielectric layer 80 is formed on the spacer 60 to cover the whole area except for the portions covered by the conductor leads 20 and 30 and the magnetic field sensing element 10. The thickness of the insulating layer 80 is somewhat less than that of the conductor leads, so as to provide an increased operational efficiency.

A dry etching technique using ion milling is employed to realize the present device. Ion milling is described in detail in the article entitled "Introduction to Ion and Plasma Etching" by S. Somekh, Journal of Vacuum Science and Technology, Vol. 13, No. 5, pp. 1003–1007, 1976 (Reference 5). According to the ion milling (i.e., ion etching) process, ions generated in an ionization chamber are accelerated to impinge on a target (a sample) in the form of collimated ion beam flux.

FIGS. 7A and 7B each shows the configuration of the conductor pattern edge, respectively, when a target is revolved on its axis and subjected to ion beams are directed at an angle $\theta$ relative to the direction normal to the target. A film 20 to be etched is formed on the substrate 50 by the evaporation or spattering method, and a photoresist pattern 90 is formed by the usual lithographic process. In terms of an angle of beam incidence which is larger than 20°, the etched pattern edge 21 gives a contour having lower and upper slopes 220 and 230 as shown in FIG. 7A. A length l, defined by the projection of the lower slope 220 onto the substrate 50, can be approximated by the following equation taking into consideration a shadowing effect:

$$\theta = \arctan\left(\frac{l}{h+d}\right)$$

where h is the thickness of the resist pattern; and d, the depth of etching. Such a contour is seen for every angle of incidence of beams except for perpendicular beams, provided a perfectly rectangular mask is used and the incident beams are perfectly collimated. Actually, the incident beams tend to disperse and a perfect rectangular mask is hardly obtainable so that the pattern edge 21 may give a slope 250 defined by a single angle $\theta$, in terms of the angle of beam incidence, which is less than 20°, as shown in FIG. 7B.

FIG. 8 shows a diagram representing the relationship between the angle of beam incidence as a parameter and the length of the lower slope 220 of the side wall shown in FIG. 7A. A film of gold of 4000 angstroms for the conductor lead 30 was etched by using photoresist of 4 microns in thickness as a mask. The dots in FIG. 8 represent experimental values; and the solid line represents, theoretical values calculated on the basis of the above-described equation. It follows consequently that the length of the lower slope 220 of the side wall is variable over a wide range by changing angle $\theta$.

Turning back to FIG. 7A, an intersection 240 between the two slopes 220 and 230 moves depending on etching time. At the time of the completion of the etching of the thickness of material 20, the intersection 240 of the etched pattern edge lies at an intermediate portion of the thickness of the material 20. As the etching progresses beyond the etching of the thickness of material 20, the intersection 240 is shifted toward the substrate 50. When the etching progresses further to reach a point equivalent to two times the thickness of the material 20, the lower slope is eventually removed, leaving only the single, upper slope 230. In general, the angle of inclination of the upper slope 230 is nearly perpendicular.

One of the important characteristics of ion milling is that the etch depth per unit time (i.e. the etching rate) depends on the angle of incidence. It is known that the etching rate generally depends on the angle of incidence and that the mode of change in the etching rate depends on the materials to be etched.

Figure 9:
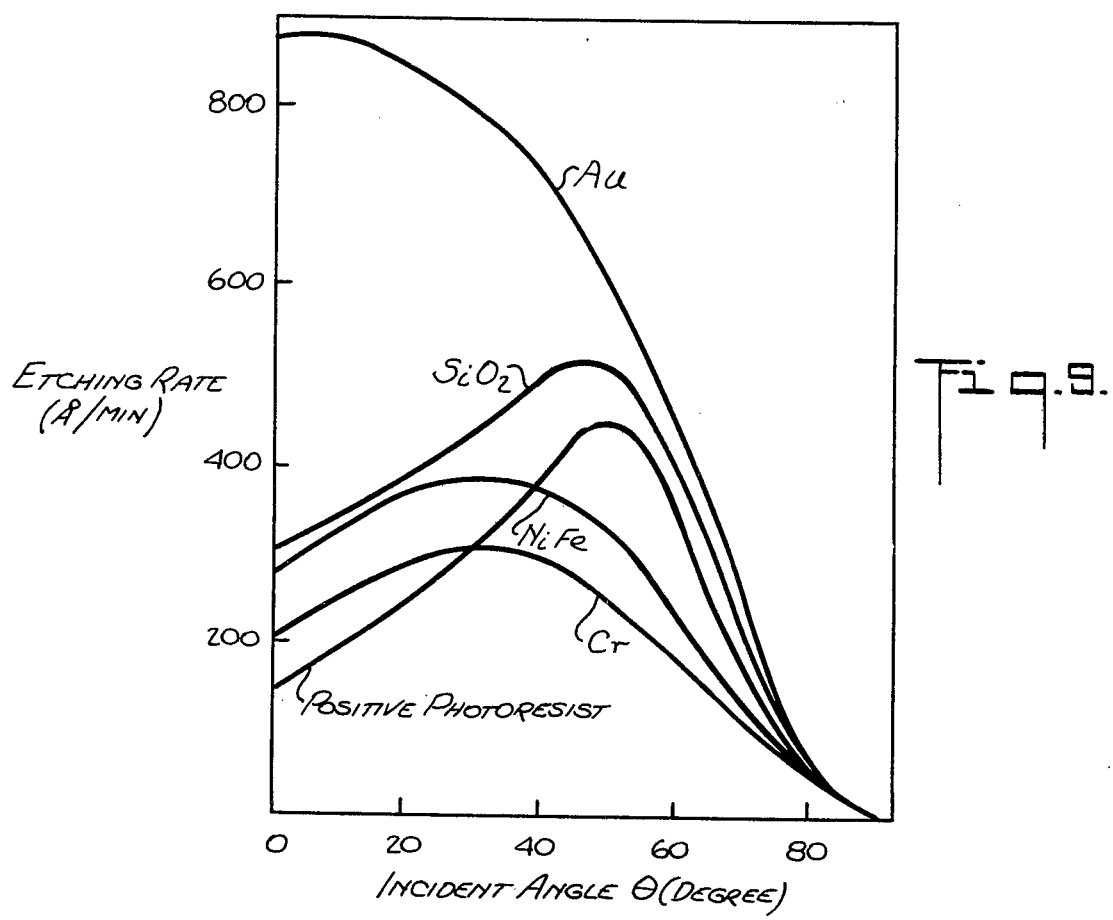

FIG. 9 illustrates the changes in etching rate versus the angle of incidence for gold (Au), silicon dioxide ($SiO_2$), permalloy (NiFe), chromium (Cr), and photoresist. These substances are respectively used as materials for the conductor lead 20, the spacer 60, the magnetic field sensing element 10, the adhesion layer 26 and the mask pattern 90. For the etching, an accelerating voltage of five hundred volts and an argon gas pressure of $2 \times 10^{-4}$ Torr were used. When it is desired to etch various materials of different properties all at a time, the knowledge of the dependence of the etching rate on the angle of incidence will be of great help in the selection of an optimum angle for the respective material, so that the etching operations for all the materials are terminated at the same time.

Referring to FIGS. 10 A through 10D and 10A' through 10D', the process for manufacturing the present detection device includes the following steps: At first, the conductor film 25 is deposited on the substrate 50 having the spacer 60. If a material such as gold which gives a weak adhesion force relative to the substrate 50 of magnetic garnet is used as the conductor film 25, then chromium is needed as an adhesion layer 26. If a material giving a strong adhesion force, such as aluminum is used, the layer 26 is not needed. The first resist pattern 90 for preliminary fabrication of the detection device is formed on the conductor film 25 (FIGS. 10A and 10A'). This pattern is formed over the entire surface of the film except for a predetermined region including an area larger than that of the sensing element 10 to be fabricated in a succeeding step. Using the resist pattern 90 as a mask, the conductor film 25 is dry-etched by ion milling at a proper incident angle. Then, a magnetic field sensing film 11 for the element 10 is deposited on the overall surface of the sample without removing the pattern 90 from the sample. The film 11 deposited on the resist pattern 90 is removed therefrom by lifting off the resist pattern 90, (FIGS. 10B and 10B'). For details of the lift-off operation, reference is made to the article entitled "High-density bubble domain shift resister" by V. Sadagopan, et al, AIP (American Institute of Physics) Conference Proceedings, No. 5, pp 215–219, 1971 (Reference 6).

A second resist mask pattern 91 having the whole pattern of the detection device is then formed (FIGS. 10C and 10C'). By using a second resist pattern 91 as a mask, a conductor pattern and a magnetic field sensing element pattern are formed simultaneously by ion milling. The essential process for manufacturing the present bubble detection device is thus completed (FIGS. 10D and 10D').

In this process, the sensing element is deposited on the conductor following the dry etching of the conductor, such that reliable electrical connection between the conductor leads and the sensing element is established. The thickness of the first resist pattern is much greater than that of the sensing element, resulting in a highly efficient lift-off operation. The mask alignment can be performed without the need for strict accuracy.

Examples for manufacturing the present device are given below.

EXAMPLE 1

This example is adapted for use in a magnetic bubble memory using a bubble of 3 microns in diameter.

Thickness of alumina of 3000 angstroms as the spacer 60, chromium of 100 angstroms as the adhesion layer 26, and gold of 4000 angstroms as the conductor 25 were successively deposited in that order onto the surface of magnetic garnet which served as the substrate 50, using a continuous electron beam evaporation method (FIG. 10A'). The positive photoresist 90 was spin-coated thereto at 2,500 r.p.m. The thickness of the photoresist 90 was on the order of 4 microns. Assuming that the dimensions of the sensing element 10 is 200 microns×4 microns, the resist pattern 90 defining a predetermined region 25 larger than the area of the element 10 was formed. For example, a mask pattern size was 206 microns×40 microns. The exposure and development conditions should preferably be determined so that side walls of said resist pattern 90 are formed to have an angle equal to or less than 90° relative to the surface of the substrate 50. The sample was set on a rotatable target table while being subjected to ion milling. A film of chromium and a film of gold (hereinafter referred to as Cr/Au film) for forming the adhesion layer 26 and the conductor leads 20, 30, respectively, were dry-etched while the target table was being turned. In terms of the angle of ion beam incidence, which is 40°, the pattern side wall of the Cr/Au film presented a contour as shown in FIG. 7A and the end-to-end length of the lower slope was 3 microns. The portion of exposed spacer 60 which resulted from the etching of the Cr/Au layer was 200 microns×34 microns. Without removing the resist pattern, permalloy (80% Ni-Fe) of 300 angstroms thickness was deposited by the electron beam evaporation method on the overall surface of the sample maintained at 100° C. to serve as a magnetic field sensing film. Following the evaporation, the resist pattern 90 was removed by a remove, along with the permalloy film deposited thereon (FIG. 10B'), the pattern 90 having side walls which give an angle equal to or less than 90° relative to the surface of the substrate 50.

The positive photoresist 91 was then spin-coated to form a layer of 0.85 micron in thickness. A resist pattern for the detection device was then formed at a predetermined area with respect to the first mask pattern by a mask alignment technique (FIG. 10C'). The Cr/Au film for the adhesion layer 26 and the conductor leads 20 and 30, and the permalloy film 11 for the magnetic field sensing element 10 were etched, simultaneously, at the ion beam incident angle of 90° by ion millng (FIG. 10D').

The permalloy film 11 was deposited over an area of 206 microns×40 microns after the first ion milling, and then processed to a width required to the detection device (for example 4 microns in width) by the second ion milling, followed by the removal of the resist 91. The fabrication of the detection device was thus completed.

The detection device thus fabricated had an effective dimension of 200 microns×4 microns and presented a resistance value of 550 ohms when the permalloy film for the element 10 was 300 angstroms in thickness. A magnetoresistance ratio ($\Delta R/R$) was 1.5% at the applied magnetic field of 200 oersteds. This magnetoresistance ratio is kept constant, as shown in FIG. 11, independently of the beam incident angle at the first ion milling. This indicates that the two different side wall contours of the conductor leads shown in FIGS. 7A and 7B can be fully adopted, and that good electrical connection between Cr/Au film and the permalloy film is provided, so that a contact resistance therebetween can be neglected. The detection device was fabricated on a layer of calcium-germanium garnet constituting the substrate 50, and the usual chevron stretcher was formed thereon, thereby preparing a bubble memory device. An output of higher than 10 millivolts was obtained at an applied current of 2 milliamperes.

In the above-mentioned process similar results were obtained using tantalum and gold or titanium and gold for the bonding layer 26 and the conductor 25; silicon dioxide or silicon oxide for the spacer 60; orthoferrite or rare earth-transition metal non-crystalline (i.e. amorphous) magnetic material for substrate 50; and an alloy of nickel and cobalt for the magnetic field sensing element 10.

EXAMPLE 2

According to a process similar to that in Example 1, a film 25 of Al-Cu alloy (3% of Cu) was used as the conductor. In this example, however, in order to prevent the oxidation of the Al-Cu film surface to be processed and the formation of an oxide layer resulting therefrom, after the dry etching by the first ion milling, the sample was held in the same equipment, and the permalloy film 11 was deposited by the ion beam spattering deposition method in one vacuum-pumping operation. This ion beam spattering deposition method provided good electrical connection between the Al-Cu film forming the conductor leads 20 and 30 and the permalloy film forming the sensing element 10, and likewise in the case where Cr/Au film was used as the conductor.

Besides using a film of Al-Cu alloy as the conductor, a 100% aluminum film or a film of Al-Si alloy may be used to give the same results.

EXAMPLE 3

According to a process similar to that in Example 1, the deposition of a permalloy film for element 10 was followed by deposition of a $SiO_2$ layer of 1000 angstroms thickness in one vacuum-pumping operation. The film of $SiO_2$ acts not only as a protective film for the permalloy film but also functions to make the etching time for the conductor portion (Cr/Au film) coincident with that for the detection element portion (NiFe/$SiO_2$ film).

EXAMPLE 4

This example further includes a step of planing the detection device.

A film of alumina ($Al_2O_3$) of 2000 angstroms thickness as the spacer 60, a film chromium of 100 angstroms thickness as the adhesion layer 26 and a film of gold of 3000 angstroms thickness as the conductor 25 were continuously deposited in this order on a layer of magnetic garnet forming the substrate 50 in this order using the electron beam evaporation method. A film of the positive photoresist 90 of 4 microns thickness was then spin-coated thereon in like manner as in Example 1. The sample was subjected to exposure and development treatments to form a resist hole of a size of 106 microns×40 microns. The Cr/Au film was then etched by ion milling at a 40° angle of ion beam incidence, in like manner as in Example 1. Without removing the resist pattern 90, a permalloy film of 300 angstroms thickness for the detection element 11 and silicon dioxide ($SiO_2$) of 2800 angstroms thickness were deposited in succession using the electron beam evaporation method on the overall surface of the sample maintained at 100° C. The permalloy film and the silicon dioxide film on the resist were removed in like manner as in Example 1. Positive photoresist 91 was then spin-coated thereon at 6200 r.p.m., to form a film thickness of 0.85 micron. As in Example 1, the resist pattern 91 for the whole of the detection device was then formed. The Cr/Au film for the conductor 25 and the adhesion layer 26 and the films of NiFe and $SiO_2$ for the sensing element 10 and the protective film 70 were dry-etched simultaneously by ion milling at an ion beam incident angle of 50°. The selection of this incident angle makes the etching time for the Cr/Au film coincident with that for the NiFe/$SiO_2$ film. This incident angle was effective to prevent a material being etched from being redeposited on the resist side wall. By increasing the etching time to twice as long as a predetermined etching time, there was obtained a pattern having substantially a vertical side wall. Without removing the resist pattern, alumina of 3100A thickness was deposited on the overall surface of the sample by the electron beam deposition method. Alumina on the resist 91 was removed by the lift-off operation, thereby providing a planed detection device.

The detection device thus obtained was fabricated on a layer of calcium-germanium garnet having a bubble size of 1.8 microns in diameter, and a known chevron bubble strethcer (as shown in FIG. 1 of Reference 1) was provided on the garnet layer, thereby preparing the bubble memory device. The use of a detection device of 100 microns×2 microns in effective size provides improved bubble propagation characteristics, and produces an output of higher than 10 millivolts at an applied current of 1 milliampere.

The detection device according to the present invention has the following three remarkable features:

1. Improved reliability

For the fabrication of the present detection device, since dry etching is employed rather than a wet process, the magnetic field sensing element can be connected to the conductor leads in a more reliable way than that obtained by the wet process. This provides operational stability free from any changes in characteristics even under environmental tests for long periods of time.

2. Increased process yield

The number of manufacturing steps is reduced with an improved process yield, and, as a result of large alignment tolerance, the mask alignment can be facilitated without lowering the process yield. All the patterns are formed by the dry etching such that variations in pattern dimensions or sizes are decreased.

3. Easy planing process

The plane of the sensing element portion is made flush with the plane of the conductor leads by placing an insulating layer on the sensing element portion. The detection device becomes uniform in thickness, as a whole, and the planing process is thereby facilitated.

One skilled in the art will appreciate that various changes or substitutions can be made without departing from the sprit and scope of the invention.

What is claimed is:

1. A thin-film magnetic bubble domain detection device comprising
   a substrate;
   a spacer formed on said substrate to cover a surface thereof;
   at least two conductor leads each respectively formed on a different surface portion of said spacer, each said conductor lead having an upper surface and a side wall thereon with at least one slope with respect to its respective spacer surface portion; and
   a magnetic field sensing element on said spacer having ends each respectively electrically connected to a different one of said conductor leads at said respective slopes thereof without being connected to the upper surface of either conductor lead.

2. A thin-film magnetic bubble domain detection device as defined in claim 1, wherein at least one slope is defined by a single angle of inclination with respect to said substrate surface.

3. A thin-film magnetic bubble domain detection device as defined in claim 2, wherein said angle is an acute angle with respect to its respective spacer surface portion.

4. A thin-film magnetic bubble domain detection device as defined in claim 1, wherein said sensing element is a magnetoresistance element.

5. A thin-film magnetic bubble domain detection device as defined in claim 1, wherein said magnetic field sensing element is a Hall element.

6. A thin-film magnetic bubble domain detection device as defined in claim 1, wherein said conductor leads are made of highly conductive metal chosen from the group consisting of gold, copper, aluminum, titanium, tantalum, chromium, and an alloy thereof.

7. A thin-film magnetic bubble domain detection device as defined in claim 1, wherein said spacer is an oxide layer chosen from the group consisting of alumina, silicon dioxide, and silicon oxide.

8. A thin-film magnetic bubble domain detection device as defined in claim 1, wherein said substrate is a rare earth-transition metal amorphous magnetic material which is adapted for supporting magnetic bubble domains thereon.

9. A thin-film magnetic bubble domain detection device as defined in claim 1, wherein said substrate is a magnetic garnet film.

10. A thin-film magnetic bubble domain detection device as defined in claim 9, wherein said substrate is a calcium-germanium garnet.

11. A thin-film magnetic bubble domain detection device comprising
    a substrate;
    a spacer formed on said substrate to cover a surface thereof;
    at least two conductor leads each respectively formed on a different surface portion of said spacer, each said conductor lead having an upper surface and a side wall thereon with at least one slope with respect to its respective spacer surface portion;
    a magnetic field sensing element on said spacer and having ends each respectively electrically connected to a different one of said conductor leads at said respective slopes thereof without being connected to the upper surface of either conductor lead; and
    a dielectric film on said sensing element.

12. A thin-film magnetic bubble domain detection device comprising:
    a substrate;
    a spacer formed on said substrate to cover a surface thereof;
    at least two conductor leads each respectively formed on a different surface portion of said spacer, each said conductor lead having an upper surface and a side wall thereon with at least one slope with respect to its respective spacer surface portion;
    a magnetic field sensing element on said spacer and having ends each respectively electrically connected to a different one of said conductor leads at said respective slopes thereof without being connected to the upper surface of either conductor lead;
    a first dielectric film on said sensing element; and
    a second dielectric film on said spacer to cover regions not covered by said conductor leads or said sensing element and first dielectric film.

13. A thin-film magnetic bubble domain detection device as defined in claim 12, wherein the thickness of the second dielectric film and the thicknesses of the conductor leads at their upper surfaces are all approximately equal to the sum of the thicknesses of the magnetic field sensing element and the first dielectric film and is also approximately equal to the thicknesses of the conductor leads, whereby the first dielectric film, the second dielectric film and the conductor leads present a planar surface.

14. A thin-film bubble domain detection device, comprising
    a generally planar magnetic substrate;
    a spacer formed on the overall upper surface of said substrate;
    two spaced conductor leads formed on the upper surface of said spacer, each lead having an upper surface and a downwardly sloping end portion that makes an acute angle with respect to the substrate under each lead, and said sloping end portions of the respective conductor leads being oppositely disposed in spaced facing relationship relative to one another to define a gap on said spacer; and a magnetic field sensing element having a generally parallelpiped body portion disposed between said two upwardly sloping end portions and formed on said substrate with said body portion extending across said gap between said opposing sloping end portions of said conductor leads, and said sensing element sloping end portions making an obtuse angle with respect to the substrate in said gap and respectively positioned in mating relationship with said respective sloping end portions of said conductor leads in electrical contact therewith without being connected to the upper surface of either conductor lead.

15. A thin-film magnetic bubble domain detection device comprising
   a substrate;
   a spacer formed on said substrate to cover a surface thereof;
   at least two conductor leads each respectively formed on a different surface portion of said spacer, each said conductor lead having a side wall thereon with at least one slope with respect to its respective spacer surface portion, wherein a side wall of one of said conductor leads has both a lower slope and an upper slope respectively defined by different angles of inclination with respect to said substrate surface, said lower slope neighboring said substrate and having a smaller angle of inclination than that of said upper slope; and
   a magnetic field sensing element on said spacer and having ends each respectively electrically connected to a different one of said conductor leads at said respective slopes thereof, with said connection to said one conductor lead being to said lower slope thereof.

16. A thin-film magnetic bubble domain detection device comprising
   a substrate;
   a spacer formed on said substrate to cover a surface thereof;
   at least two conductor leads each respectively formed on a different surface portion of said spacer, each said conductor lead having a side wall thereon with at least one slope with respect to its respective spacer surface portion;
   a magnetic field sensing element on said spacer and having ends each respectively electrically connected to a different one of said conductor leads at said respective slopes thereof; and
   a dielectric film on said sensing element, said dielectric film having a width and a length which are substantially equal, respectively, to the width and length of said magnetic field sensing element.

17. A thin-film magnetic bubble domain detection device as defined in claim 16, wherein the sum of the thickness of said dielectric film and said magnetic field sensing element on said spacer is substantially equal to the thickness of said conductor leads on said spacer.

18. A thin-film magnetic bubble domain detection device comprising:
   a substrate;
   a spacer formed on said substrate to cover a surface thereof;
   at least two conductor leads each respectively formed on a different surface portion of said spacer, each said conductor lead having a side wall thereon with at least one slope with respect to its respective spacer surface portion;
   a magnetic field sensing element on said spacer and having ends each respectively electrically connected to a different one of said conductor leads at said respective slopes thereof;
   a first dielectric film on said sensing element; and
   a second dielectric film on said spacer to cover regions not covered by said conductor leads or said sensing element and first dielectric film, wherein the sum of the thicknesses of said first dielectric film and said magnetic field sensing element on said spacer is substantially equal to the thickness of said conductor leads on said spacer.

19. A thin-film magnetic bubble domain detection device as defined in claim 18, wherein the thickness of said second dielectric film is slightly less than the thickness of said conductor leads.

20. A thin-film magnetic bubble domain detection device as defined in claim 18, wherein said substrate is planar; wherein said spacer, conductor leads, magnetic field sensing element, first dielectric film and second dielectric film are all formed in planar layers parallel to said substrate; and wherein the relative thicknesses of said spacer, conductor leads, magnetic field sensing element, first dielectric film and second dielectric film are such that the device is planar.

21. A thin-film magnetic bubble domain detection device, comprising
   a generally planar magnetic substrate;
   a spacer formed on the overall upper surface of said substrate;
   two spaced conductor leads formed on the upper surface of said spacer, each lead having a downwardly sloping end portion that makes an acute angle with respect to the substrate under each lead, and said sloping end portions of the respective conductor leads being oppositely disposed in spaced facing relationship relative to one another to define a gap on said spacer;
   a magnetic field sensing element having a generally parallelpiped body portion disposed between said two upwardly sloping end portions and formed on said substrate with said body portion extending across said gap between said opposing sloping end portions of said conductor leads, and said sensing element sloping end portions making an obtuse angle with respect to the substrate in said gap and respectively positioned in mating relationship with said respective sloping end portions of said conductor leads in electrical contact therewith;
   a dielectric layer formed on the overall upper surface of said sensing element, said dielectric layer having a width and length generally equal to the width and length of said sensing element, and said dielectric layer having a configuration with respect to the sensing element such that the combined structure of said dielectric layer and said sensing element forms a continuous flush contour joining said opposing sloping ends of said conductor leads.

22. A thin-film magnetic bubble domain detection device as defined in claim 21, further comprising a second dielectric layer formed on the overall upper surface of said spacer except on those areas occupied by said conductor leads, said sensing element or said first dielectric layer, and said second dielectric layer being of a thickness to present a planar contour.

* * * * *

UNITED STATES PATENT AND TRADEMARK OFFICE
CERTIFICATE OF CORRECTION

PATENT NO. : 4,302,822
DATED : NOVEMBER 24, 1981
INVENTOR(S) : SOTARO ESHO and HIROSHI GOKAN It is certified that error appears in the above—identified patent and that said Letters Patent is hereby corrected as shown below:

Title page, [54], delete "AND PROCESS FOR MANUFACTURING SAME";

Column 1, line 4, delete "AND PROCESS FOR MANUFACTURING SAME";

line 17, delete "a";

Column 2, line 2, after "level", insert -- or spacing --.

Signed and Sealed this

Twenty-third Day of February 1982

[SEAL]

*Attest:*

*Attesting Officer*

GERALD J. MOSSINGHOFF

*Commissioner of Patents and Trademarks*